(12) United States Patent
Tonegawa et al.

(10) Patent No.: US 7,091,123 B2
(45) Date of Patent: Aug. 15, 2006

(54) METHOD OF FORMING METAL WIRING LINE INCLUDING USING A FIRST INSULATING FILM AS A STOPPER FILM

(75) Inventors: Takashi Tonegawa, Tokyo (JP); Yasuaki Tsuchiya, Tokyo (JP); Tomoko Inoue, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/231,175

(22) Filed: Aug. 30, 2002

(65) Prior Publication Data

US 2003/0049927 A1 Mar. 13, 2003

(30) Foreign Application Priority Data

Sep. 4, 2001 (JP) ............................. 2001/268111

(51) Int. Cl.
*H01L 21/4763* (2006.01)
(52) U.S. Cl. ..................... 438/633; 438/634; 438/645; 438/692
(58) Field of Classification Search ................ 438/622, 438/626–629, 631–634, 637–640, 643–645, 438/648, 672–65, 684–688, 692, 693
See application file for complete search history.

(56) References Cited

U.S. PATENT DOCUMENTS

| | | | |
|---|---|---|---|
| 6,043,146 A * | 3/2000 | Watanabe et al. ........... | 438/623 |
| 6,150,272 A * | 11/2000 | Liu et al. .................... | 438/692 |
| 6,235,633 B1 * | 5/2001 | Jang ........................... | 438/675 |
| 6,265,307 B1 * | 7/2001 | Lou ............................ | 438/633 |
| 6,284,050 B1 * | 9/2001 | Shi et al. .................... | 118/715 |
| 6,309,801 B1 * | 10/2001 | Meijer et al. ............... | 430/313 |
| 6,358,832 B1 * | 3/2002 | Edelstein et al. ........... | 438/612 |
| 6,380,078 B1 * | 4/2002 | Liu et al. .................... | 438/638 |
| 6,753,249 B1 * | 6/2004 | Chen et al. ................. | 438/637 |
| 2001/0029091 A1 * | 10/2001 | Meijer et al. ............... | 438/584 |
| 2003/0096498 A1 * | 5/2003 | Chopra et al. ............. | 438/678 |
| 2003/0181050 A1 * | 9/2003 | Hu et al. .................... | 438/694 |

FOREIGN PATENT DOCUMENTS

| JP | 11-274122 | 10/1999 |
|---|---|---|
| JP | 2000-223490 | 8/2000 |

* cited by examiner

*Primary Examiner*—Thanh Nguyen
(74) *Attorney, Agent, or Firm*—McGinn IP Law Group, PLLC

(57) ABSTRACT

In a method of forming a metal wiring line, a first insulating film is formed directly or indirectly on a semiconductor substrate. A second insulating film is formed on the first insulating film. A wiring line groove is formed to pass through the second insulating film to an inside of the first insulating film. A conductive film is formed to fill the wiring line groove and to cover the second insulating film. The conductive film and the second insulating film are removed by a first CMP polishing process, using the first insulating film as a stopper film, until the first insulating film is exposed.

39 Claims, 5 Drawing Sheets

Fig. 5

| POLISHING PARTICLES | ALMINA | HUMED SILICA | COLLOIDAL SILICA |
|---|---:|---:|---:|
| Ta (N) | 100 | 100 | 100 |
| SiO2 | 40 | 20 | 20 |
| POLYPHENYLENE | 20 | 10 | 1 |

METHOD OF FORMING METAL WIRING LINE INCLUDING USING A FIRST INSULATING FILM AS A STOPPER FILM

BACKGROUND OF THE INVENTION

1. Field of the Invention

The present invention relates to a method of forming a metal wiring line of a semiconductor device.

2. Description of the Related Art

With the enlargement of a chip size and the miniaturization of a minimum processing dimension, an interval between wiring lines, the sectional area of the wiring line decrease, and the length of the wiring line increases. In association with them, the capacitance and resistance of the wiring line are sharply increased, resulting in a larger propagation delay of a signal.

In order to reduce the wiring line capacitance, it is tried to decrease the dielectric constant of an interlayer insulating film. An insulating material with a small dielectric constant is typically used in order to decrease the dielectric constant to a small value. For example, a method is known of decreasing the relative dielectric constant to about 3 by doping impurities into a conventional inorganic silicon dioxide film with the relative dielectric constant of 4.2. Otherwise, a method is known of using an organic polymer with the relative dielectric constant of 2 to 3, as the insulating film. This dielectric constant value is lower than that of the silicon dioxide film.

As a method of decreasing the wiring line resistance, a method is known of replacing aluminum with the specific resistance of 3.0 Ωcm used in the conventional wiring line by copper with the specific resistance of 1.7 Ωcm. Also, since an average wiring line length is inversely proportional to the number of wiring layers, the wiring line may be formed as a multiple-layer. Also, the multiple-layer wiring line is formed to have a wider width. In this case, of the wiring line, the upper layer having the smaller resistance is used for global wiring, and the lower layer is used for local wiring in a highly integrated circuit. This structure can decrease the wiring line resistance while reducing the chip area. As a result, the employment of those methods makes it the propagation delay to be largely reduced.

However, the conventional multiple-layer wiring technique has the following problems. That is, the problems will be described with reference to FIGS. 1A to 1C. FIGS. 1A to 1C are cross section views showing a process for forming a damascene wiring line in a semiconductor device.

The semiconductor device shown in FIGS. 1A to 1C includes a substrate 101, an interlayer insulating film 102, a hard mask 103, a barrier film 104, a metal wiring line film 105 and a wiring line groove 106.

The substrate 101 is a silicon substrate on which semiconductor elements, wiring lines and the like are formed.

The interlayer insulating film 102 is an insulating film formed of an organic material such as a polymer of a hydrocarbon system. The dielectric constant of the interlayer insulating film 102 is small, differently from an inorganic insulating film such as a silicon dioxide film. For example, the interlayer insulating film 102 has the relative dielectric constant of 2.0 to 3.0.

The hard mask 103 is an insulating film formed of an inorganic material such as silicon dioxide. However, the hard mask 103 may be formed of silicon dioxide including hydrogen group or methyl group such as silicon nitride (SiN), silicon carbide (SiC), silicon carbide nitride (SiCN), MSQ (Methyl Silsesquioxane) and HSQ (Hydrogen Silsesquioxane). The structure of the hard mask is not limited to a single layer. The hard mask 103 may has a lamination structure in which a plurality of films are laminated. The hard mask 103 is essential to protect the interlayer insulating film 102 in a photolithography process for forming a wiring line groove. Also, the hard mask 103 has a stopper function when the barrier film 104 is polished by using a chemical mechanical polishing (CMP) method.

The barrier film 104 is a thin metal film. The barrier film 104 protects the metal wiring line film 105 from being diffused into the interlayer insulating film 102. For example, the barrier film 104 is formed of titanium nitride and tantalum.

The metal wiring line film 105 is formed of a metal with a small specific resistance. The metal wiring line film 105 is formed in the wiring line groove formed in the insulating film, and is used for a damascene wiring line. For example, the metal wiring line film 105 is formed of copper.

Next, the manufacturing process will be described below.

In FIG. 1A, the interlayer insulating film 102 and the hard mask 103 are formed on the substrate 101 in order. Then, wiring line grooves 106 are formed by the photolithography process. After that, the barrier film 104 and the metal wiring line film 105 are deposited.

In FIG. 1B, the metal wiring line film 105 is polished by a first CMP polishing process in which the barrier film 104 is used as a stopper film. Consequently, an upper portion of the metal wiring line film 105 located above the barrier film 104 is removed.

In FIG. 1C, the barrier film 104 is polished by a second CMP polishing process in which the hard mask 103 is used as a stopper film. Consequently, the barrier film 104 and an upper portion of the metal wiring line films 105 located above the hard mask 103 are removed.

However, as shown in FIGS. 1A to 1C on the left sides, in a portion in which the wiring lines are dense, a rate of a total area of the exposed metal wiring line films 105 is equal to or greater than that of the exposed hard mask 103. For this reason, when the barrier film 104 is polished in the second polishing process, the hard mask 103 is excessively polished and thinned around the exposed portion of the metal wiring line films 105. On the other hand, such phenomenon is never caused in the right side portion of FIGS. 1A to 1C. That is, the hard mask 103 remains in its original state. Thus, since the cross section area of the wiring lines are different depending on a position, the pattern dependency of the wiring line resistance becomes larger.

Also, since the polishing result of the hard mask 103 is different depending on the position, many concave and convex portions are induced on the surface of the substrate. When a multiple-layer wiring line is to be formed, concave and convex portions become larger in the upper layer if a step difference due to the concave and convex portions are induced for each layer. In this case, because of a focal depth in an exposing process, it is difficult to form the desirable film pattern. Hence, a CMP-polishing process of the interlayer insulating film is required in order to solve the step difference.

In addition, in the conventional technique, the hard mask 103 remains in its original state even after the CMP polishing process. The hard mask 103 is typically an inorganic insulating film, and the dielectric constant of the hard mask 103 is larger than that of the interlayer insulating film 102. Thus, the wiring line capacitance increases due to the difference in the dielectric constant. The increase in the wiring line capacitance leads to the increase in the propagation delay. Hence, this has a severe influence on the improvement of an integration degree.

In conjunction with the above-mentioned description, Japanese Laid Open Patent Application (JP-A-Heisei 11-274122) discloses a semiconductor device and a method of manufacturing the same. This reference will be described below with reference to FIGS. 1A to 1C. This reference uses an organic SOG film as the hard mask 103. Because the dielectric constant of the organic SOG film is smaller than that of silicon dioxide film, a parasitic capacitance between wiring lines can be reduced. Also, in the CMP polishing process using aluminum abrasive particles, the hard mask 103 functions as an effective stopper in the second CMP polishing process of the barrier film 104 in FIG. 1C. However, the dielectric constant of the organic SOG film is higher than that of the interlayer insulating film 102. Also, the organic SOG film is not removed after the second CMP polishing process.

Also, Japanese Laid Open Patent Application (JP-P2000-223490A) discloses a method of manufacturing a semiconductor device. This reference will be described below with reference to FIGS. 1A to 1C. In this reference, the hard mask 103 is removed by plasma etching after the second CMP polishing process of the barrier film 104 in FIG. 1C. Then, an entire copper wiring is covered by an insulating film with a low dielectric constant formed of the same material as the interlayer insulating film 102. Through the above-mentioned processes, the parasitic capacitance between the wiring lines can be largely reduces. However, the hard mask 103 is removed by a plasma etching, so that a tact time increases extremely, and the throughput decreases extremely. Also, there may be a possibility of increase in a cost of a processing apparatus.

SUMMARY OF THE INVENTION

Therefore, an object of the present invention is to provide a method of forming a metal wiring line, which can decreases a wiring line capacitance and reduce a propagation delay.

Another object of the present invention is to provide a method of forming a metal wiring line, which can improve flatness of the surface of an interlayer insulating film after the wiring formation and easily make the formation of a multiple-layer possible.

Still another object of the present invention is to provide a method of forming a metal wiring line, which can make a sectional area of a wiring line uniform and improve a distribution of wiring line resistances on a wafer surface.

It is another object of the present invention to provide a method of forming a metal wiring line, which can reduce a propagation delay while suppressing an increase in a manufacturing cost.

Another object of the present invention is to provide a method of forming a metal wiring line, which can reduce a propagation delay while suppressing a reduction in a throughput.

In an aspect of the present invention, a method of forming a metal wiring line, is achieved by (a) forming a first insulating film directly or indirectly on a semiconductor substrate; by (b) forming a second insulating film on the first insulating film; by (c) forming a wiring line groove to pass through the second insulating film to an inside of the first insulating film; by (d) forming a conductive film to fill the wiring line groove and to cover the second insulating film; and by (e) removing the conductive film and the second insulating film by a first CMP polishing process, using the first insulating film as a stopper film, until the first insulating film is exposed.

Here, the (d) forming step may be achieved by (f) forming a first conductive film to cover an inner wall surface of the wiring line groove and to cover the second insulating film; and by (g) forming a second conductive film to fill the wiring line groove and to cover the first conductive film. Also, the (e) removing step may be achieved by (h) removing the second conductive film until the first conductive film is exposed; and by (i) removing the first conductive film, the second conductive film and the second insulating film by the first CMP polishing process, using the first insulating film as a stopper film, until the first insulating film is exposed.

The (h) removing step may be carried out using a second CMP polishing method. In this case, first slurry used in the (h) removing step may be different from second slurry used in the (i) removing step.

A polishing selection ratio of the second slurry of a polishing rate of the second insulating film to a polishing rate of the first insulating film is preferably 5 or above.

Also, the second slurry contains abrasive particles, and a diameter of each of the abrasive particles is preferably in a range of 0.01 to 1 µm.

Also, the second slurry may contain colloidal silica.

Also, the first insulating film may function as a stopper film in the (i) removing step.

Also, the first insulating film may have a dielectric constant lower than that of silicon dioxide.

Also, the first insulating film has an organic insulating film.

Also, the relative dielectric constant of the organic insulating film is preferably in a range of 2.0 to 3.0.

Also, the organic insulating film may be formed of at least a material selected the group consisting of a hydrocarbon system polymer and aromatic polymer. More specifically, the organic insulating film may be formed of at least a material selected the group consisting of polyphenylene, poly-allyl-ether, poly-allylene, and benzocyclobutene.

Also, the organic insulating film may be a porous film.

Also, the conductive film and the second conductive film may be formed of copper.

In another aspect of the present invention, a method of forming a metal wiring line, my be achieved by (a) forming an organic insulating film with a dielectric constant lower than that of silicon dioxide directly or indirectly on a semiconductor substrate; by (b) forming an inorganic insulating film on the organic insulating film; by (c) forming a wiring line groove to pass through the second insulating film to an inside of the first insulating film; by (d) forming a first conductive film to cover an inner wall surface of the wiring line groove and to cover the second insulating film; by (e) forming a second conductive film to fill the wiring line groove and to cover the first conductive film; and by (f) removing the first and second conductive films and the inorganic insulating film by a first CMP polishing process using slurry containing abrasive particles, until the organic insulating film is exposed. A polishing selection ratio of the abrasive particles of a polishing rate of the second insulating film to a polishing rate of the first insulating film is 5 or above.

The (f) removing step may be achieved by (g) removing the second conductive film by a second CMP polishing process, until the first conductive film is exposed; and by (h) removing the first conductive film, the second conductive film and the inorganic insulating film by the first CMP polishing process, using the organic insulating film as a stopper film, until the organic insulating film is exposed.

Here, the slurry contains abrasive particles, and a diameter of each of the abrasive particles is in a range of 0.01 to 1 μm.

Also, the diameter of each of the abrasive particles is preferably in a range of 0.01 to 1 μm.

Also, the abrasive particles are formed of colloidal silica.

Also, the organic insulating film may be formed of at least a material selected the group consisting of a hydrocarbon system polymer and aromatic polymer. More specifically, the organic insulating film is preferably formed of at least a material selected the group consisting of polyphenylene, poly-allyl-ether, poly-allylene, and benzocyclobutene.

Also, it is preferable that diameters of the abrasive particles are within ±50% of an average diameter of the diameters.

BRIEF DESCRIPTION OF THE DRAWINGS

FIG. 5 is a diagram showing a relation between a polishing rate of an abrasive particle and a film to be polished, in the semiconductor device manufacturing method according to the embodiment of the present invention.

DESCRIPTION OF THE PREFERRED EMBODIMENT

Figure 1A:
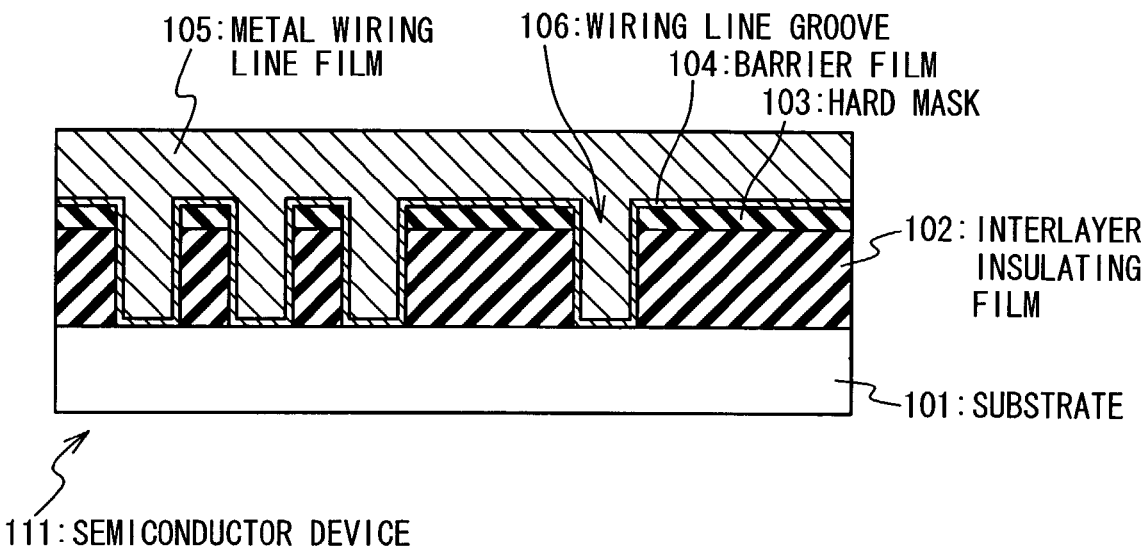
FIGS. 1A to 1C are cross sectional views showing a semiconductor device manufactured by a conventional manufacturing method.
Figure 1B:
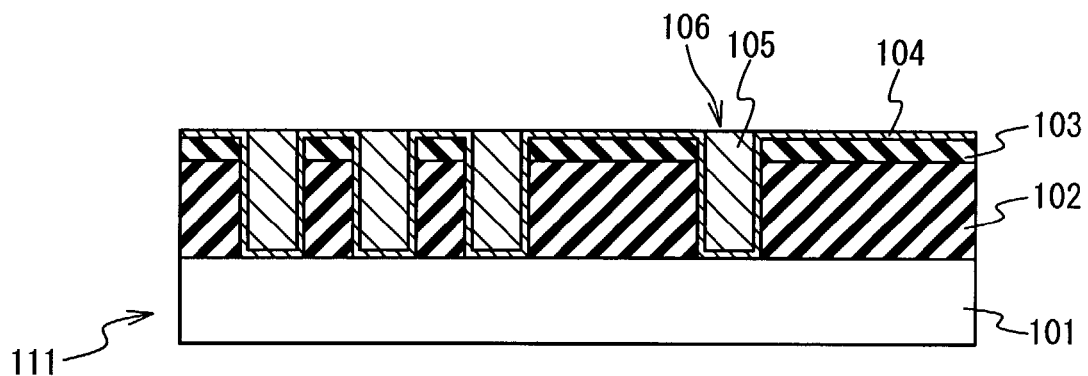
Figure 1C:
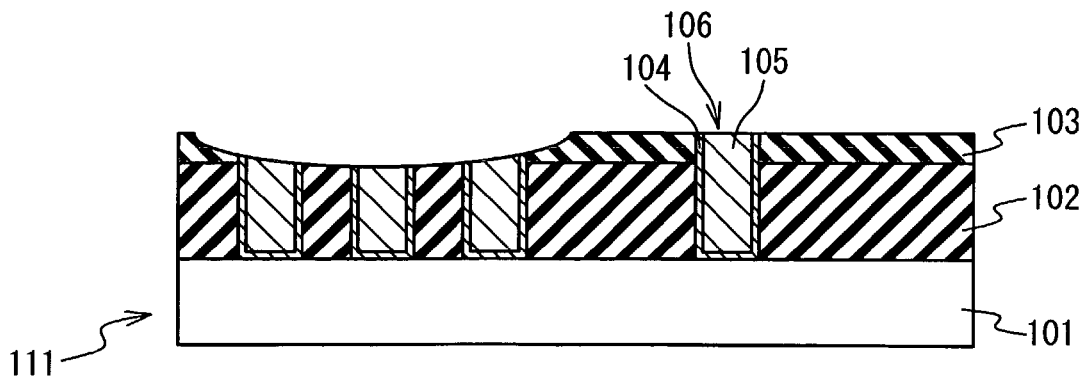

Hereinafter, a method of manufacturing a semiconductor device of the present invention will be described in detail with reference to the attached drawings.

The method of manufacturing a semiconductor device of the present invention will described by exemplifying a semiconductor device having an interlayer insulating film of one layer and a wiring line groove formed therein. However, the present invention can be applied to a semiconductor device having the of a multiple-layer wiring structure in which interlayer insulating films of plural layers and a wiring line groove formed in each of the layers.

FIGS. 2A to 2D are cross sectional views showing a method of forming a metal wiring line in the semiconductor device manufacturing method according to an embodiment of the present invention.

The semiconductor device shown in FIGS. 2A to 2D has a substrate 1, an interlayer insulating film 2, a hard mask 3, a metal wiring line film 5 and wiring line grooves 6.

In the present invention, a new process is introduced to remove the hard mask 3, which is essential in a wiring line forming process, by a chemical mechanical polishing (CMP) method after the formation of the wiring lines of a damascene wiring structure. Thus, the wiring line capacitance (parasitic capacitance) is reduced which influences on the propagation delay. At this time, in the CMP polishing process, abrasive particles are selected to have a high selection ratio of a polishing rate of the hard mask 3 to a polishing rate of the interlayer insulating film 2. Such abrasive particles are discovered by the inventors of the present invention. The wiring line capacitance can be decreased by using the abrasive particles and by using the hard mask 3 as a stopper film to the interlayer insulating film 2 in the CMP polishing process. Thus, the multiple-layer wiring structure with high flatness can be formed easily and accurately by carrying out the CMP polishing process.

The semiconductor substrate 1 has semiconductor elements, wiring lines and the like formed directly or indirectly on the semiconductor substrate 1. The semiconductor substrate 1 is a silicon substrate in this embodiment. However, another substrate may be used. An inorganic insulating film may be formed of silicon dioxide or silicon nitride may be formed on the substrate 1. Moreover, the semiconductor substrate 1 may have a multiple-layer structure of the insulating films in which a plurality of wiring structures and elements are embedded. In this embodiment, the semiconductor substrate 1 is a silicon substrate on which a silicon dioxide film is formed.

The interlayer insulating film 2 is an insulating film formed on the substrate 1 by using a CVD method, a spin coating method and the like. The interlayer insulating film 2 is formed of organic material to insulate between the wiring lines, between the wiring line and the semiconductor element and between the semiconductor elements. The organic material has a low dielectric constant to decrease the parasitic capacitance of the wiring line. In this embodiment, the organic material having the low dielectric constant of 3.0 or less is used, differently from that of an inorganic insulating film such as a silicon dioxide film having the relative dielectric constant of 4.2. The interlayer insulating film 2 has a function as a polishing stopper film when the hard mask 3 is polished by a CMP polishing method. The film thickness of the interlayer insulating film 2 is about 300 nm. The interlayer insulating film may be a porous film.

Figure 4:
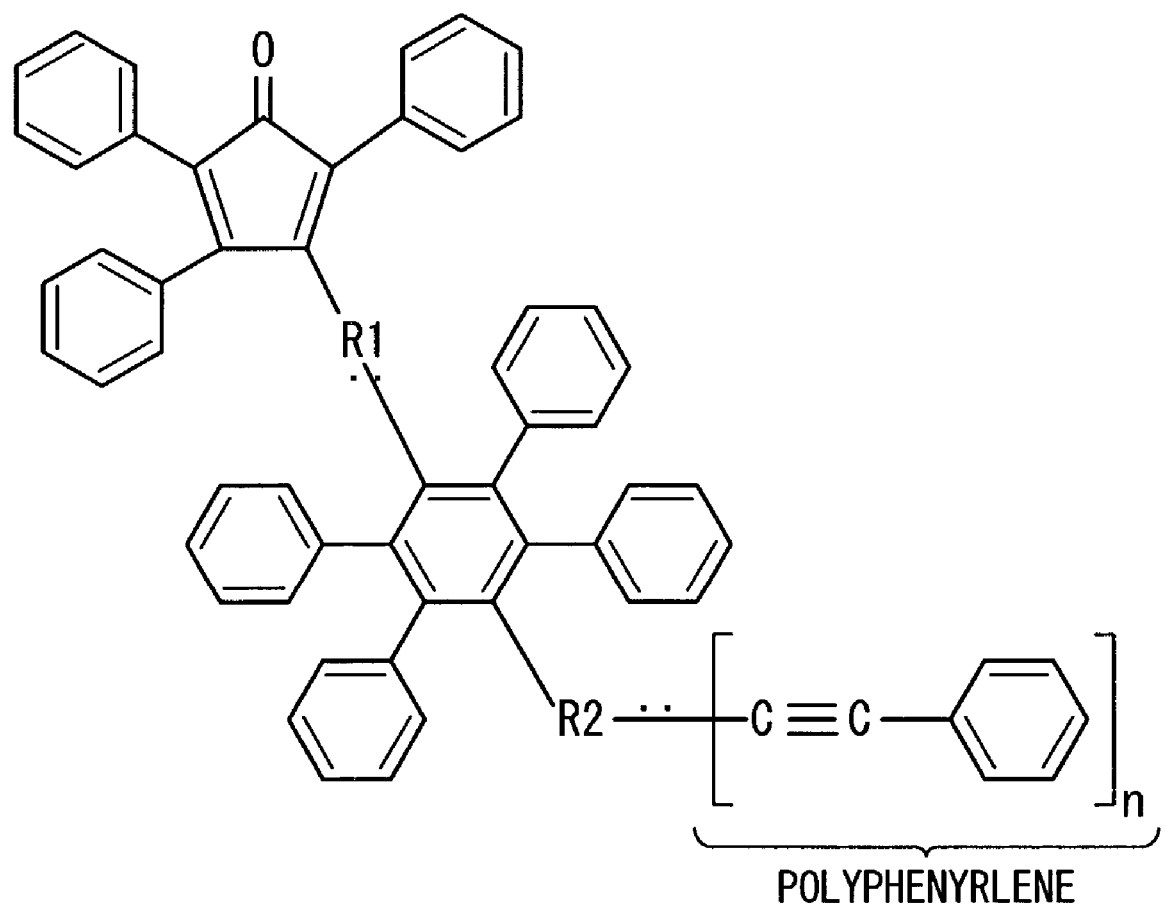
FIG. 4 is a view showing the structure of a typical abrasive particle used in the semiconductor device manufacturing method according to the embodiment of the present invention.

The interlayer insulating film 2 is a film with a low dielectric constant of an organic polymer system. For example, as shown in FIG. 4, as the organic material of the film 2, the following materials may be used: a hydrocarbon system polymer such as poly-phenylene with the relative dielectric constant of 2.7, like SiLK commercially available from Dow Chemical Co., Ltd, in which ends are modified by poly-nuclear aromatic; poly-allyl-ether with the relative dielectric constant of 2.4, like Flare-2.0 commercially available from Allied Signal Co., Ltd; aromatic polymer such as Alcap commercially available from Asahi Chemical Industry Co., Ltd and poly-allylene; and benzocyclobutene with the relative dielectric constant of 2.7, like DVS-BCB commercially available from Dow Chemical Co., Ltd. In this embodiment, poly-phenylene is used.

In addition, the following materials may be used: poly-tetra-fluoro-ethylene with the relative dielectric constant of 1.9, fluorinated-amorphous-carbon with the relative dielectric constant of 2.1, parylene with the relative dielectric constant of 2.3, fluorinated-polyimide, plasma-CF-polymer, plasma-CH-polymer and the like.

The hard mask 3 as a second insulating film is an insulating film formed on the interlayer insulating film 2 by a CVD method, a spin coating method and the like. The hard mask 3 protects the interlayer insulating film 2 in a photo-lithography process for forming the wiring line groove 6. Also, the hard mask 3 has a function as a polishing stopper film when the barrier film 4 is polished by using the CMP polishing method. The hard mask 3 is formed of inorganic material such as silicon dioxide, silicon nitride and silicon carbide. Also, the hard mask 3 may be formed of silicon dioxide doped with organic material, organic group, hydrogen, hydroxyl group and the like as impurity. Also, the hard mask 3 may have a multiple-layer structure in which the above-mentioned films are laminated. The relative dielectric constant of the hard mask 3 is about 4.2 in case of the silicon dioxide and about 3.0 in case of silicon dioxide doped with the impurity. In this embodiment, the hard mask 3 is a silicon dioxide film, and the film thickness of the hard mask 3 is about 100 nm.

As described above, a film that does not substantially, intentionally or positively contain silicon element is used as the interlayer insulating film 2. A film containing silicon element is used as the hard mask 3. Thus, when the interlayer insulating film 2 is used as the polishing stopper film and silica material (colloidal silica) is used for CMP abrasive particles, the hard mask 3 can be easily polished while the interlayer insulating film 2 is protected.

The wiring line groove 6 is formed for a damascene wiring line. The wiring line groove 6 is formed so as to penetrate the hard mask 3 and extend into the interlayer insulating film 2 by using a photolithography technique. In this embodiment, the depth of the wiring line groove is 400 nm, and the width thereof is 200 nm.

The barrier film 4 as a first conductive film is a thin metal film formed on the hard mask 3 and the inner wall surface of the wiring line groove 6 by using a sputtering method, a depositing method, a CVD method and the like. The barrier film 4 protects the metal wiring line film 5 from being diffused into the interlayer insulating film 2. The barrier film 4 is formed of a high melting point metal or its nitride. For example, the barrier film 4 is formed of tantalum, tantalum nitride, titanium nitride and a lamination film of them. In this embodiment, the barrier film 4 is formed of tantalum nitride, and the film thickness of the barrier film 4 is about 30 nm.

The metal wiring line film 5 as a second conductive film is formed to fill the wiring line groove 6 and to cover the barrier film 4, by using a sputtering method, a depositing method, a plating method and the like. Finally, a portion of the metal wiring line film 5 formed in the wiring line groove 6 becomes a damascene wiring line. The metal wiring line film 5 is formed of a metal with a low specific resistance. For example, the metal wiring line film 5 is formed of copper, aluminum or tungsten. Copper is used in this embodiment. Typically, the film thickness of the metal wiring line film 5 has 1200 nm (=400 nm for the wiring line groove 6 (the hard mask 3+the interlayer insulating film 2)+800 nm for a portion above the barrier film 4) immediately after the formation of the metal wiring line film 5.

Next, the chemical mechanical polishing (CMP) process will be described below with reference to FIG. 3. FIG. 3 is a schematic cross sectional view showing the structure of a CMP polishing apparatus. The CMP polishing apparatus having the structure shown in FIG. 2 is prepared for one kind of CMP polishing process. The CMP polishing apparatus is composed of a polishing head section 12 to which the substrate 11 is attached, a polishing pad 13, a pad table 14, a slurry supply mechanism 15 and slurry 16.

Figure 2A:
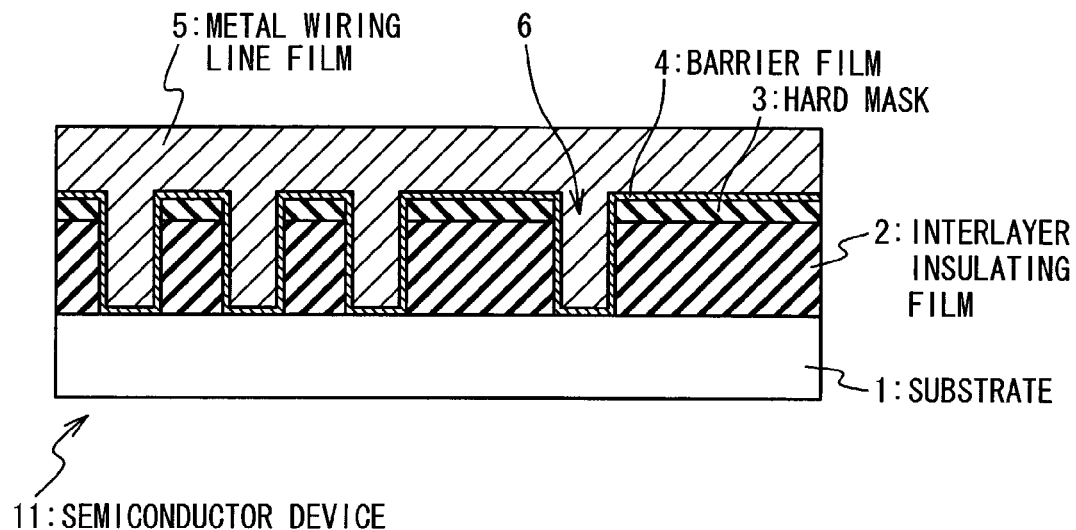
FIGS. 2A to 2D are cross sectional views showing a semiconductor device manufactured by a method of manufacturing a semiconductor device according to an embodiment of the present invention.
Figure 2B:
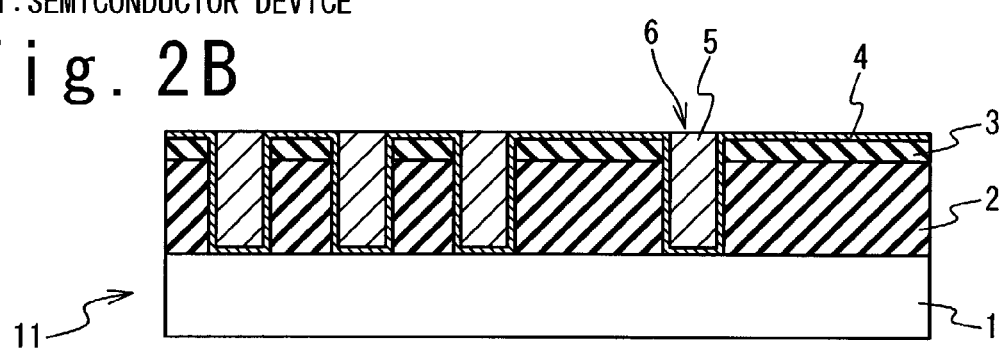
Figure 3:
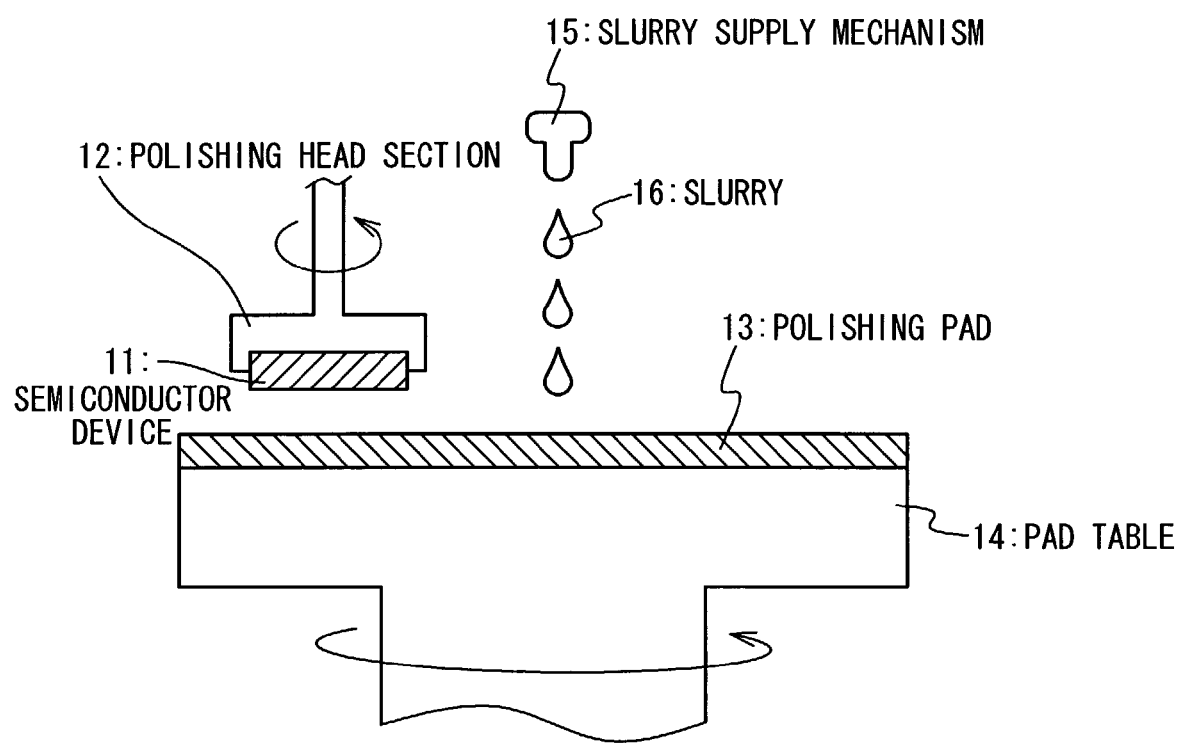
FIG. 3 is a schematic diagram showing a CMP polishing apparatus used in the semiconductor device manufacturing method according to the embodiment of the present invention.

The substrate 11 is a semiconductor wafer (substrate 1+interlayer insulating film 2+hard mask 3+barrier film 4+metal wiring line film 5) as shown in FIG. 2A. The substrate 11 is supported by the polishing head 12 to direct the polished surface of the substrate 11 to the polishing pad 13.

The polishing head 12 pushes the substrate 11 against the polishing pad 13 in a constant pressure, while supporting or holding the substrate 11. Also, in order to achieve the uniformity of the polishing process, the polishing head 12 may be rotated and carry out a swinging motion.

The polishing pad 13 is installed on the upper portion of the pad table 14, and polishes the substrate 11 while holding the slurry 16. Typically, the polishing pad 13 is a pad formed of foaming poly-urethane.

In the pad table 14, the temperature is controlled by a water cooling system (not shown) in order to avoid the deformation of the pad table 14 caused by the temperature as much as possible. Material with a high rigidity and a small linear expansion coefficient is used for the pad table 14. For example, the pad table 14 is formed of aluminum ceramics.

The slurry 16 contains abrasive particles, and the slurry supply mechanism 15 supplies the slurry 16 at a desired supply rate, while preventing the particles from being dried and condensed in solvent. Also, the slurry supply mechanism 15 has a mechanism to keep the concentration of the solvent.

The typical polishing condition of the CMP polishing apparatus shown in FIG. 3 is as follows.

| | |
|---|---|
| Substrate pushing pressure: | 4 psi |
| Rotation frequency of head 12: | 80 rpm |
| Rotation frequency of pad 13: | 80 rpm |
| Slurry supply rate: | 200 cc/min. |

It should be noted that the present invention is not limited to the CMP polishing apparatus shown in FIG. 3. Another apparatus used in the conventional technique may be similarly used. Also, the polishing conditions are not limited to the above-mentioned conditions in the present invention.

The slurry 16 is chemical solution containing the abrasive particles to chemically and mechanically polish and remove the metal wiring line film 5, the barrier film 4 and the hard mask 3. The slurry containing the abrasive particles formed of material such as alumina or manganese oxide is used for the CMP polishing process of the conductive film such as the metal wiring line film 5 and the barrier film 4. However, it is not necessary to use the same slurry for the metal wiring line film 5 and the barrier film 4. Also, if they can be polished and removed in the CMP polishing process, the slurry is not limited to them. Different slurries may be used. For example, various types of slurry may be used such as slurry that contains different abrasive particles, slurry that does not contain the abrasive particles, and slurry used in the CMP polishing process of the hard mask 3.

The slurry containing the abrasive particles of a silica system is used for the CMP polishing process of the hard mask 3. The slurry 16 is used which has a high selection ratio of a polishing rate to the hard mask 3 to a polishing rate to the interlayer insulating film 2, i.e., the polishing amount of the hard mask 3 greater than that of the interlayer insulating film 2. Thus, the interlayer insulating film 2 can be used as the polishing stopper film in the CMP polishing process of the hard mask 3.

The conditions of the slurry for the hard mask 3 are as follows.

(1) An average particle diameter of a primary particle is in a range of 0.01 to 1 μm, and preferably 0.02 to 0.1 μm. The excessively small particle diameter is not desired since the polishing rate is slow so as to take a long time for the polishing process. Also, the excessively large particle diameter is not desired since the polishing rate is fast, resulting in a possibility of a roughly finished surface. Also, the uniform polishing can be attained when a distribution of the particle diameters is narrow and the particle diameters are uniformed. It is desirable that the distribution of the particle diameters has ±50% of the average particle diameter, preferably of ±30% thereof.

(2) The dispersion degree is high. It is desirable that the dispersion degree of the primary particles is high, and the condensation of the primary particles is little. Thus, the size of a secondary particle is small. Since the dispersion degree is high, the original property of the primary particle can be reflected, which leads to the uniform polishing property.

(3) The mechanical polishing force is weak. It is desired that the primary particle has the shape close to a ball and does not have angles. That is, if there is no angle in the primary particle, the particle diameter is small (1) and the condensation is little (2), the mechanical polishing force becomes weak, which leads to the finely finished surface.

As the above-mentioned abrasive particle, colloidal silica whose average particle diameter is 0.01 to 1 μm is used in this embodiment.

FIG. 5 is a table showing a polishing rate of a typical abrasive particle to a polished film. Alumina, fumed silica and colloidal silica are exemplified as the abrasive particles. Cases are shown where the polished films are Ta (tantalum) and TaN (tantalum nitride) for the barrier film 4, $SiO_2$ (silicon dioxide) film for the hard mask 3, and poly-phenylene (SiLK) for the interlayer insulating film 2.

It is supposed that the polishing rate in the respective abrasive particles is 100 when the film is formed of Ta (and TaN). At this time, the polishing rates of the respective abrasive particles to the respective films are as follows. That is, in case of the alumina abrasive particle, $SiO_2$: 40, and poly-phenylene: 20. In case of the fumed silica abrasive particle, $SiO_2$: 20, and poly-phenylene: 10. Also, in case of the colloidal silica abrasive particle, $SiO_2$: 20, and poly-phenylene: 1. That is, if the colloidal silica is used to polish the hard mask 3 using the interlayer insulating film 2 (poly-phenylene film) as the polishing stopper film, the interlayer insulating film 2 (poly-phenylene) is not substantially polished (the selection ratio of 20:1) when the polishing of the hard mask 3 ($SiO_2$) is ended. Thus, the polishing process is inevitably ended. Also, in view of the CMP polishing process, the above-mentioned selection ratio is desired to be at least 5:1 or more. The selection ratio is further desired to be 10:1 or more.

When the slurry meets the above slurry conditions (1) to (3) for the hard mask 3, the selection ratio of a polishing rate of the hard mask 3 (the insulating film containing inorganic silicon) to a polishing rate of the interlayer insulating film 2 (the organic insulating film with the low dielectric constant) is considered to be high. Thus, not only the colloidal silica but also the slurry meeting the above-mentioned slurry conditions ((1) to (3)) is the desirable slurry.

The method of forming the metal wiring line in the semiconductor device manufacturing method of the present invention will be described below with reference to the attached drawings.

In FIG. 2A, the interlayer insulating film 2 is formed on the substrate 1 by a spin coating method or a CVD method. Subsequently, the hard mask 3 is formed on the interlayer insulating film 2 by a spin coating method or a CVD method. Then, the wiring line grooves 6 are formed so as to penetrate the hard mask 3 and to extend into the interlayer insulating film 2 by a photolithography process. At this time, the hard mask 3 protects the interlayer insulating film 2 from damage caused by the etching. After that, a sputtering method is used to form the barrier film 4 on the hard mask 3 and to cover the inner wall surfaces of the wiring line grooves 6. Then, a sputtering method is used to form the metal wiring line film 5. As a result, the wiring line groove 6 is filled and the barrier film 4 is covered.

Next, the substrate 1 is conveyed to a first CMP apparatus. Then, in the state of FIG. 2A, a first CMP polishing process to the metal wiring line film 5 is carried out using the barrier film 4 as the polishing stopper film. The first slurry used in this case is the above-mentioned slurry for the metal wiring line film 5. The CMP polishing conditions are the above-mentioned conditions. Thus, a portion of the metal wiring line film 5 located above the barrier film 4 is removed. At that time, the substrate 1 is in the state shown in FIG. 2B.

After the first CMP polishing process, the substrate 1 is conveyed to a second CMP apparatus by a transport mechanism. Then, in the state shown in FIG. 2B, a second CMP polishing process to the barrier film 4 and the hard mask 3 is carried out to polish the both films at a time, using the interlayer insulating film 2 as the polishing stopper film. The second slurry used in this case is the above-mentioned slurry for the hard mask 3. The colloidal silica is used in this case. The polishing conditions are the above-mentioned conditions. At this time, the barrier film 4, the hard mask 3 and a portion of the metal wiring line film 5 above the interlayer insulating film 2 at the wiring line groove 6 are removed. Thus, the surface of the interlayer insulating film 2 is exposed. That is, the substrate 1 is in the state shown in FIG. 2D through the state shown in FIG. 2C, since the barrier film 4 is removed.

Figure 2C:
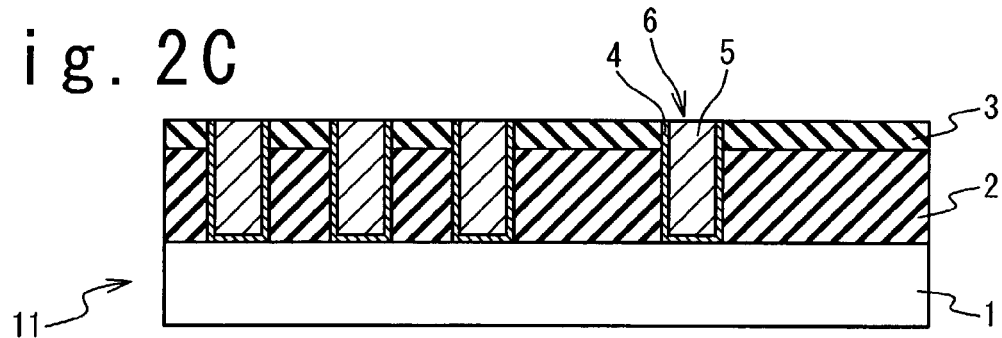

In FIG. 2C, the selection ratio of the abrasive particle of a polishing rate of the hard mask 3 to a polishing rate of the interlayer insulating film 2 in the CMP polishing process is very large (20:1). Thus, the hard mask 3 (and the wiring line portion contained in the hard mask 3) can be perfectly removed without polishing the interlayer insulating film 2. That is, the interlayer insulating film 2 can be used as the polishing stopper film in the second CMP polishing process.

Even in the portion where the wiring lines are densified, it is possible to polish the hard mask 3 similarly to the sparse portion. That is, the flat surface finish can be attained irrespectively of the density of the wiring lines. Thus, the flatness of the surface can be extremely improved to thereby exclude the CMP step of the interlayer film, resulting in easiness the formation of a multiple-layer.

In addition, the hard mask 3 having a larger dielectric constant than that of the interlayer insulating film 2 is removed, after the second CMP polishing process. That is, it is possible to reduce a parasitic capacitance between the wiring lines or a wiring line capacitance.

Figure 2D:
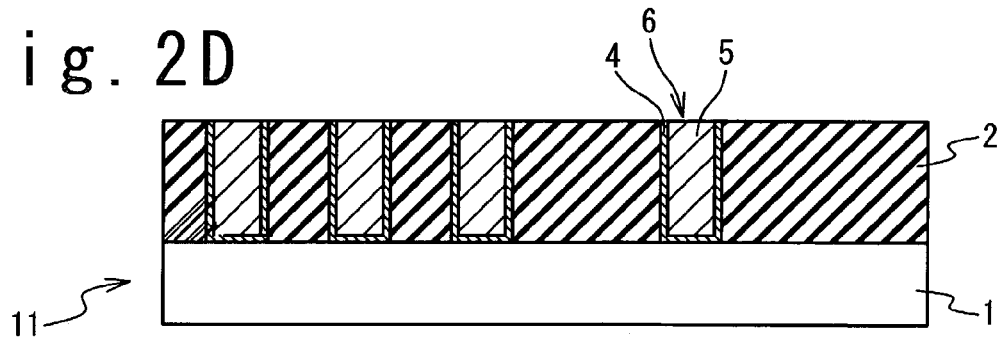

Moreover, after FIG. 2D, the multiple-layer wiring structure whose wiring line capacitance is very small can be formed by laminating an interlayer insulating film with the small dielectric constant and repeating. The decrease in the wiring line capacitance leads to the decrease in the propagation delay. Thus, the present invention is effective in further improving the integration of the semiconductor device.

In the method of forming the metal wiring line of the present invention, the CMP polishing process of the hard mask 3 is added to the conventional second polishing process which contains the polishing process of only the barrier film 4. However, from the viewpoint of the step, the polishing of the barrier film 4 is only extended in its original state. That is, the CMP polishing process is carried out on the same platen of the same CMP apparatus under the same polishing condition. Thus, the hard mask 3 can be precisely polished without any substantial decrease in the throughput. Also, it is possible to obtain the technique that is effective for the realization of the multiple-layer of elements at the low cost in association with the miniaturization of the minimum processing dimension.

It should be noted that in the above-mentioned process, the two CMP apparatuses referred to as the first and second CMP apparatuses are used. However, a CMP apparatus which has the mechanism shown in FIG. 3 may be used to carry out the two CMP polishing processes.

Also, in the embodiment, the barrier film 4 may be omitted.

Also, in the second polishing process, the barrier film 4 and the hard mask 3 are polished by using the same slurry continuously. However, this process may be carried out by dividing the process (a second polishing process) into a process for polishing the barrier film 4 and a process (a third polishing process) for polishing the hard mask 3, using the slurries and the polishing conditions such as the pushing pressure, the rotation frequency and the like which are respectively different from each other. In this case, the conventional polishing conditions may be used for the barrier film 4 in the second polishing process, and the above-mentioned polishing conditions may be used to polish the barrier film 4 and the hard mask 3 at the same time in the third polishing process. Since the slurry and the polishing conditions which are optimal for the respective films can be applied, the polishing process can be carried out further precisely.

In this case, the first to third polishing processes are carried out as the continuous CMP polishing processes. That is, a different process such as a plasma etching process is not used during these CMP polishing processes. Thus, the manufacturing method is smoothly progressed. The usage of the CMP apparatus having three platens enables the consistent CMP process to be carried out in one apparatus. Thus, although the number of the CMP operations is increased by one, there is not a substantial increase in the tact time, and there is not a substantial decrease in the throughput. Hence, it is possible to obtain the technique effective for the formation of the multiple-layer of elements at the low cost in association with the miniaturization of the minimum processing dimension.

According to the present invention, it is possible to suppress the increase in the manufacturing cost, and decrease the parasitic capacitance between the wiring lines. Also, it is possible to reduce the propagation delay, improve the flatness on the surface of the interlayer insulating film after the wiring line formation, and easily make into the multiple-layer.

What is claimed is:

1. A method of forming a metal wiring line, comprising:
   forming a first insulating film over a semiconductor substrate;
   forming a second insulating film on said first insulating film;
   forming a wiring line groove to pass through said second insulating film to an inside of said first insulating film;
   forming a barrier metal film comprising a first portion formed on an inner surface of said wiring line groove and a second portion formed on said second insulating film;
   forming a conductive film to fill said wiring line groove and to cover said barrier metal film;
   removing said conductive film by a first CMP polishing process, using a first slurry, until said barrier metal film is exposed; and
   removing said first and second portions of said barrier metal film, said conductive film and said second insulating film by a second CMP polishing process using a second slurry which is different from said first slurry, and using said first insulating film as a stopper film, until said first insulating film is exposed,
   wherein said second slurry used in said second CMP polishing process comprises abrasive particles and has a polishing selection ratio of a polishing rate of said second insulating film to a polishing rate of said first insulating film of at least 5.

2. The method according to claim 1, wherein said barrier metal film covers an inner surface of said wiring line groove and covers said second insulating film.

3. The method according to claim 1, wherein said polishing selection ratio is at least 10.

4. The method according to claim 1, wherein each of said first slurry and said second slurry comprises abrasive particles, and a diameter of said abrasive particles is in a range of 0.01 µm to 1 µm.

5. The method according to claim 1, wherein said second slurry comprises colloidal silica.

6. The method according to claim 1, wherein said first insulating film functions as said stopper film in said removing said first and second portions of said barrier metal film, said conductive film and said second insulating film.

7. The method according to claim 1, wherein said first insulating film comprises a dielectric constant lower than that of silicon dioxide.

8. The method according to claim 1, wherein said first insulating film comprises an organic insulating film.

9. The method according to claim 8, wherein a relative dielectric constant of said organic insulating film is in a range of 2.0 to 3.0.

10. The method according to claim 8, wherein said organic insulating film comprises at least one of a hydrocarbon system polymer and an aromatic polymer.

11. The method according to claim 8, wherein said organic insulating film comprises at least one of polyphenylene, poly-allyl-ether, poly-allylene, and benzocyclobutene.

12. The method according to claim 8, wherein said organic insulating film comprises a porous film.

13. The method according to claim 1, wherein said conductive film comprises copper.

14. The method according to claim 1, wherein a diameter of each of said abrasive particles is in a range of 0.02 µm to 0.1 µm.

15. The method according to claim 1, wherein said first slurry comprises a colloidal silica material.

16. The method according to claim 1, wherein said first CMP polishing process is substantially continuous.

17. The method according to claim 1, wherein said second insulating film is completely removed by said second CMP polishing process.

18. The method according to claim 1, wherein said first slurry comprises abrasive particles, said abrasive particles having diameters within 50% of an average diameter of said diameters.

19. The method according to claim 1, wherein said second insulating film comprises an inorganic insulating film.

20. The method according to claim 1, wherein said second insulating film is removed in a single step.

21. The method according to claim 1, wherein said second insulating film is removed without polishing said first insulating film.

22. The method of forming a metal wiring line according to claim 1, wherein said polishing selection ratio is at least 20:1.

23. A method of forming a metal wiring line, comprising:
forming an organic insulating film having a dielectric constant lower than that of silicon dioxide over a semiconductor substrate, said organic insulating film comprising a first insulating film;
forming an inorganic insulating film on said first insulating film, said inorganic insulating film comprising a second insulating film;
forming a wiring line groove to pass through said second insulating film to an inside of said first insulating film;
forming a barrier metal film comprising a first portion formed on an inner surface of said wiring line groove and a second portion formed on said second insulating film;
forming a conductive film to fill said wiring line groove and to cover said barrier metal film; and
removing said conductive film by a first CMP polishing process using a first slurry until said barrier metal film is exposed;
removing said first and second portions of said barrier metal film, said conductive film and said second insulating film by a second CMP polishing process using a second slurry and using said first insulating film as a stopper film, until said first insulating film is exposed,
wherein said second slurry comprises a polishing selection ratio of a polishing rate of said second insulating film to a polishing rate of said first insulating film which is at Least 5.

24. The method according to claim 23, wherein first CMP polishing process uses said barrier metal film as a stopper film, and said second CMP polishing process said organic insulating film as a stopper film.

25. The method according to claim 23, wherein said abrasive particles comprise colloidal silica.

26. The method according to claim 23, wherein a relative dielectric constant of said organic insulating film is in a range of 2.0 to 3.0.

27. The method according to claim 23, wherein said organic insulating film comprises at least one of a hydrocarbon system polymer and an aromatic polymer.

28. The method according to claim 23, wherein said organic insulating film comprises at least one of polyphenylene, poly-allyl-ether, poly-allylene, and benzocyclobutene.

29. The method according to claim 23, wherein diameters of said abrasive particles are within 50% of an average diameter of the diameters.

30. The method according to claim 23, wherein said first CMP polishing process is substantially continuous.

31. The method according to claim 23, wherein said second insulating film is completely removed by said second CMP polishing process.

32. The method according to claim 23, wherein said organic insulating film comprises a porous film.

33. The method according to claim 23, wherein said selection ratio is at least 10.

34. The method according to claim 23, wherein said first insulating film is formed on said semiconductor substrate.

35. The method according to claim 23, wherein said first insulating film is indirectly formed on said semiconductor substrate.

36. The method according to claim 23, wherein said second insulating film is removed in a single step.

37. The method according to claim 23, wherein said second insulating film is removed without polishing said first insulating film.

38. The method of forming a metal wiring line according to claim 23, wherein said polishing selection ratio is at least 10:1.

39. A method of forming a metal wiring line, comprising:
forming a first insulating film on a semiconductor substrate;
forming a second insulating film on said first insulating film;
forming a wiring line groove to pass through said second insulating film to an inside of said first insulating film;
forming a barrier metal film which comprises a first portion formed in said wiring line groove and a second portion formed on said second insulating film;
forming a conductive film on said barrier metal film;
removing said conductive film by a first CMP polishing process, using said barrier metal film as a stopper film, until said barrier metal film is exposed; and
removing said first and second portions of said barrier metal film and said second insulating film by a second CMP polishing process, using said first insulating film as a stopper film, until said first insulating film is exposed,
wherein said first CMP polishing process uses a first slurry and said second CMP process uses a second slurry which is different than said first slurry, and
wherein said first insulating film comprises an organic insulating film and said second slurry comprises silica.

* * * * *